United States Patent
Lane et al.

(10) Patent No.: US 6,507,216 B1
(45) Date of Patent: Jan. 14, 2003

(54) EFFICIENT ARRANGEMENT OF INTERCONNECTION RESOURCES ON PROGRAMMABLE LOGIC DEVICES

(75) Inventors: Christopher F. Lane, Campbell, CA (US); Giles V. Powell, Alameda, CA (US); Wayne Yeung, San Francisco, CA (US); Chiakang Sung, Milpitas, CA (US); Bruce B. Pedersen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/908,308

(22) Filed: Jul. 17, 2001

Related U.S. Application Data

(63) Continuation of application No. 09/441,773, filed on Nov. 17, 1999.
(60) Provisional application No. 60/109,417, filed on Nov. 18, 1998.

(51) Int. Cl.⁷ .............................................. H03K 19/177
(52) U.S. Cl. ............................. 326/41; 326/38; 326/39; 326/40
(58) Field of Search ...................................... 326/37–41

(56) References Cited

U.S. PATENT DOCUMENTS

| 3,473,160 A | 10/1969 | Wahlstrom | 340/172.5 |
| 4,609,986 A | 9/1986 | Hartmann et al. | 364/200 |

(List continued on next page.)

FOREIGN PATENT DOCUMENTS

| EP | 463746 A2 | 1/1992 | G06F/15/60 |
| EP | 630115 A2 | 12/1994 | H03K/19/177 |
| WO | WO 95/04404 | 2/1995 | H03K/19/177 |
| WO | WO 95/22205 | 8/1995 | H03K/19/177 |

OTHER PUBLICATIONS

R. C. Minnick, "A Survey of Microcellular Research," Journal of the Association for Computing Machinery, vol. 14, No. 2, pp. 203–41, Apr. 1967.
S. E. Wahlstrom, "Programmable Logic Arrays—Cheaper by the Millions," Electronics, Dec. 11, 1967, pp. 90–95.
*Recent Developments in Switching Theory*, A. Mukhopadhyay, ed., Academic Press, New York, 1971, chapters VI and IX, pp. 229–254 and 369–422.
*The Programmable Gate Array Data Book*, 1988, Xilinx, Inc., San Jose, CA.
El Gamal et al., "An Architecture for Electrically Configurable Gate Arrays," IEEE Journal of Solid–State Circuits, vol. 24, No. 2, Apr. 1989, pp. 394–398.
El–Ayat et al., "A CMOS Electrically Configurable Gate Array," IEEE Journal of Solid–State Circuits, vol. 24, No. 3, Jun. 1989, pp. 752–762.
*ACT Family Field Programmable Gate Array Databook*, Apr. 1992, Actel Corporation, Sunnyvale, CA, pp. 1–35 through 1–44.
*The Programmable Logic Data Book*, 1994, Xilinx, Inc., San Jose, CA, pp. 2–7, 2–12, and 2–13.
"XC5000 Logic Cell Array Family, Technical Data, Advance Information," Xilinx, Inc., Feb. 1995.

*Primary Examiner*—Michael Tokar
*Assistant Examiner*—Vibol Tan
(74) *Attorney, Agent, or Firm*—Fish & Neave; Michael E. Shanahan; Jeffrey C. Aldridge

(57) ABSTRACT

Interconnection block arrangements for selectively interconnecting logic on a programmable logic device is provided. Programmable logic connectors within the interconnection blocks may be programmed to route signals between the various conductors on the device and to route signals from various logic regions on the device to the various conductors. The interconnection blocks are arranged to optimize the use of metallization resources and to increase interconnectivity and logic density.

20 Claims, 6 Drawing Sheets

U.S. PATENT DOCUMENTS

| | | | |
|---|---|---|---|
| 4,617,479 A | 10/1986 | Hartmann et al. | 307/465 |
| 4,642,487 A | 2/1987 | Carter | 307/465 |
| 4,677,318 A | 6/1987 | Veenstra | 307/465 |
| 4,713,792 A | 12/1987 | Hartmann et al. | 364/900 |
| 4,758,745 A | 7/1988 | Elgamal et al. | 307/465 |
| 4,774,421 A | 9/1988 | Hartmann et al. | 307/465 |
| 4,871,930 A | 10/1989 | Wong et al. | 307/465 |
| 4,899,067 A | 2/1990 | So et al. | 307/465 |
| 4,912,342 A | 3/1990 | Wong et al. | 307/465 |
| 5,023,606 A | 6/1991 | Kaplinsky | 340/825.8 |
| 5,073,729 A | 12/1991 | Greene et al. | 307/465.1 |
| 5,121,006 A | 6/1992 | Pedersen | 307/465 |
| 5,122,685 A | 6/1992 | Chan et al. | 307/465.1 |
| 5,132,571 A | 7/1992 | McCollum et al. | 307/465.1 |
| 5,144,166 A | 9/1992 | Camarota et al. | 307/465.1 |
| 5,208,491 A | 5/1993 | Ebeling et al. | 307/465 |
| 5,218,240 A | 6/1993 | Camarota et al. | 307/443 |
| 5,220,214 A | 6/1993 | Pedersen | 307/465 |
| 5,225,719 A | 7/1993 | Agrawal et al. | 307/465 |
| RE34,363 E | 8/1993 | Freeman | 307/465 |
| 5,255,203 A | 10/1993 | Agrawal | 364/489 |
| 5,258,668 A | 11/1993 | Cliff et al. | 307/465 |
| 5,260,610 A | 11/1993 | Pedersen et al. | 307/465 |
| 5,260,611 A | 11/1993 | Cliff et al. | 307/465 |
| 5,274,581 A | 12/1993 | Cliff et al. | 364/784 |
| 5,338,984 A | 8/1994 | Sutherland | 307/465.1 |
| 5,350,954 A | 9/1994 | Patel | 307/465 |
| 5,371,422 A | 12/1994 | Patel et al. | 326/41 |
| 5,448,186 A | 9/1995 | Kawata | 326/41 |
| 5,455,525 A | 10/1995 | Ho et al. | 326/41 |
| 5,457,410 A | 10/1995 | Ting | 326/41 |
| 5,467,029 A | 11/1995 | Taffe | 326/41 |
| 5,469,003 A | 11/1995 | Kean | 326/39 |
| 5,483,178 A | 1/1996 | Costello et al. | 326/41 |
| 5,509,128 A | 4/1996 | Chan | 395/311 |
| 5,537,057 A  * | 7/1996 | Leong et al. | 326/41 |
| 5,541,530 A | 7/1996 | Cliff et al. | 326/41 |
| 5,689,195 A | 11/1997 | Cliff et al. | 326/41 |
| 5,977,793 A  * | 11/1999 | Reddy et al. | 326/41 |
| 5,999,016 A  * | 12/1999 | McClintock et al. | 326/41 |
| 6,107,824 A  * | 8/2000 | Reddy et al. | 326/41 |
| 6,107,825 A  * | 8/2000 | Lane et al. | 326/41 |

\* cited by examiner

EFFICIENT ARRANGEMENT OF INTERCONNECTION RESOURCES ON PROGRAMMABLE LOGIC DEVICES

This application is a continuation of U.S. patent application Ser. No. 09/441,773, filed Nov. 17, 1999, which claims the benefit of U.S. provisional application No. 60/109,417, filed Nov. 18, 1998.

BACKGROUND OF THE INVENTION

The present invention relates to programmable logic devices ("PLDs"), and more particularly, to efficient arrangement of resources that are used to interconnect various portions of a programmable logic device.

Programmable logic devices are well known as is shown, for example, by Pedersen et al. U.S. Pat. No. 5,260,610 and Cliff et al. U.S. Pat. No. 5,260,611.

There is continued interest in programmable logic devices with greater logic capacity. This calls for devices with larger numbers of regions of programmable logic. It also calls for logic devices with a greater number of interconnection conductors for making needed connections between the increased numbers of logic regions. It is important, however, to organize interconnection conductors judiciously so that they provide flexible interconnectivity, but do not begin to take up excessive amounts of space on the device, thereby unduly interfering with the amount of additional logic that can be included in the device. To accomplish this, it would be desirable to find ways to organize the interconnection resources on programmable logic devices so that the efficiency of utilization of the interconnection resources can be maximized. More interconnectivity could therefore be provided in the device to serve more logic in the device without simply adding more interconnection resources with the increased logic capability.

It is therefore an object of this invention to provide improved arrangements of interconnection conductors for programmable logic devices.

It also an object of the invention to provide programmable logic device conductor arrangements that can efficiently and flexibly interconnect larger numbers of programmable logic regions than previously possible.

SUMMARY OF THE INVENTION

These and other objects of the invention are accomplished in accordance with the principles of the present invention by providing arrangements for interconnection resources on programmable logic devices that have a plurality of super-regions of programmable logic disposed on the device in a two-dimensional array of intersecting rows and columns. Each logic super-region in such a programmable logic device includes a plurality of regions of programmable logic and a plurality of inter-region interconnection conductors associated with the regions for conveying signals to and between the regions in that super-region. Each region may include a plurality of subregions of programmable logic. A typical subregion is programmable to perform any of several logical operations on a plurality of input signals applied to the subregion to produce an output signal of the subregion. Programmable logic connectors and local conductors may be associated with the regions for selectively bringing signals from the associated inter-region conductors to the subregions in that region for use as inputs. Interconnection groups may be used to selectively apply subregion output signals to the associated inter-region conductors.

A plurality of horizontal inter-super-region interconnection conductors may be associated with each row of super-regions for selectively conveying signals to, from, and between the super-regions in the that row. Similarly, a plurality of vertical inter-super-region interconnection conductors may be associated with each column of super-regions for selectively conveying signals to, from, and between the super-regions in that column.

The local conductors for selectively bringing signals into the region may include region-feeding conductors for bringing signals into the programmable logic region and local feedback conductors for making output signals of the region available as inputs to the region (i.e., recirculating signals within a given programmable logic region). The region-feeding conductors are programmably connectable to the inter-region interconnection conductors. The region feeding conductors convey signals from the inter-region interconnection conductors to the inputs of the subregions in the region. The local feedback conductors may be programmably connectable to the input of the subregions. The local feedback conductors supply feedback signals from the subregions to the inputs of the subregions.

Programmable interconnection groups may be used for various interconnection tasks such as turning signals traveling on inter-super-region and inter-region conductors onto other conductors and applying subregion output signals to the inter-super-region and inter-region conductors. The interconnection groups are typically organized so that they selectively direct signals from logic regions and inter-region and inter-super-region conductors to other inter-region and inter-super-region conductors.

The interconnection resources within each interconnection group may be divided into a plurality of interconnection blocks disposed on the programmable logic device in order to facilitate inter-connectivity, optimize use of the metallization resources, and increase the logic density of the device. A set of interconnection blocks may be associated with each programmable logic region for routing signals to and/or from an associated logic region, an adjacent logic region, or one or more inter-region or inter-super-region conductor signals. The interconnection blocks may arranged such that they handle certain interconnection functions. For example, each set of interconnection blocks may include vertical, horizontal, and local interconnection blocks that route signals to and from specific conductors and logic regions so that interconnection within the programmable logic device is facilitated. In addition, interconnection conductors may be distributed throughout the device to allow a more efficient use of the metallization resources and lessen the effects of cross-talk. This allows programmable logic devices to have increased logic density and to be easily scaled to smaller integrated circuit technologies.

Some of the programmable interconnection blocks, such as those near the periphery of the device, may also receive signals from input/output ("I/O") pins. These interconnection blocks may be used to route signals from the I/O pins to the appropriate conductors on the device. Some I/O pins may have dedicated interconnection blocks that route signals to one or more inter-super-region conductors and/or one or more inter-region interconnection conductors.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
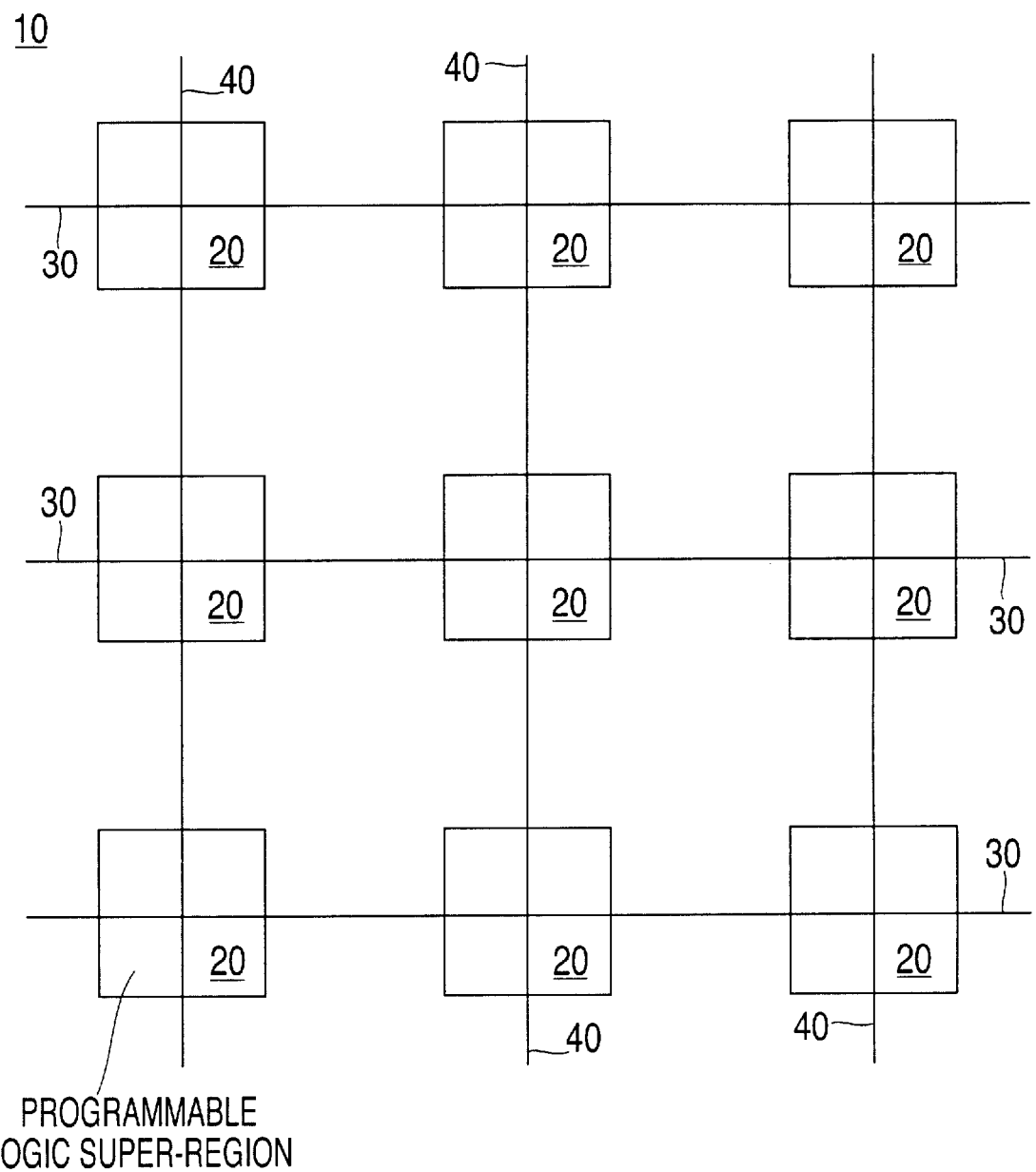
FIG. 1 is a diagram of an illustrative programmable logic device that may be used in accordance with the present invention.

FIG. 1 shows an exemplary embodiment of a programmable logic integrated circuit device 10 including a plurality of programmable logic super-regions 20 disposed on the device in a two-dimensional array of rows and columns. Programmable logic super-regions such as programmable logic super-regions 20 are sometimes referred to as groups of logic array blocks (GOLs).

A plurality of inter-super-region horizontal interconnection conductors 30 are associated with each of the rows of device 10 and a plurality of vertical inter-super-region interconnection conductors 40 are associated with each of the columns. The number of rows and columns (i.e., three in each case) shown in FIG. 1 is merely illustrative, and any number of rows and columns can be provided as desired. Although not shown in FIG. 1, device 10 preferably has input/output circuitry and pins for connecting device 10 to external circuitry. Such input/output circuitry may be disposed around the periphery of the device and may be programmably connected to conductors 30 and 40.

Terms like "row" and "column," "horizontal" and "vertical," "left" and "right," "upper" and "lower," and other directional or orientational terms are used herein only for convenience, and that no fixed or absolute directions or orientations are intended by the use of these terms.

Figure 2:
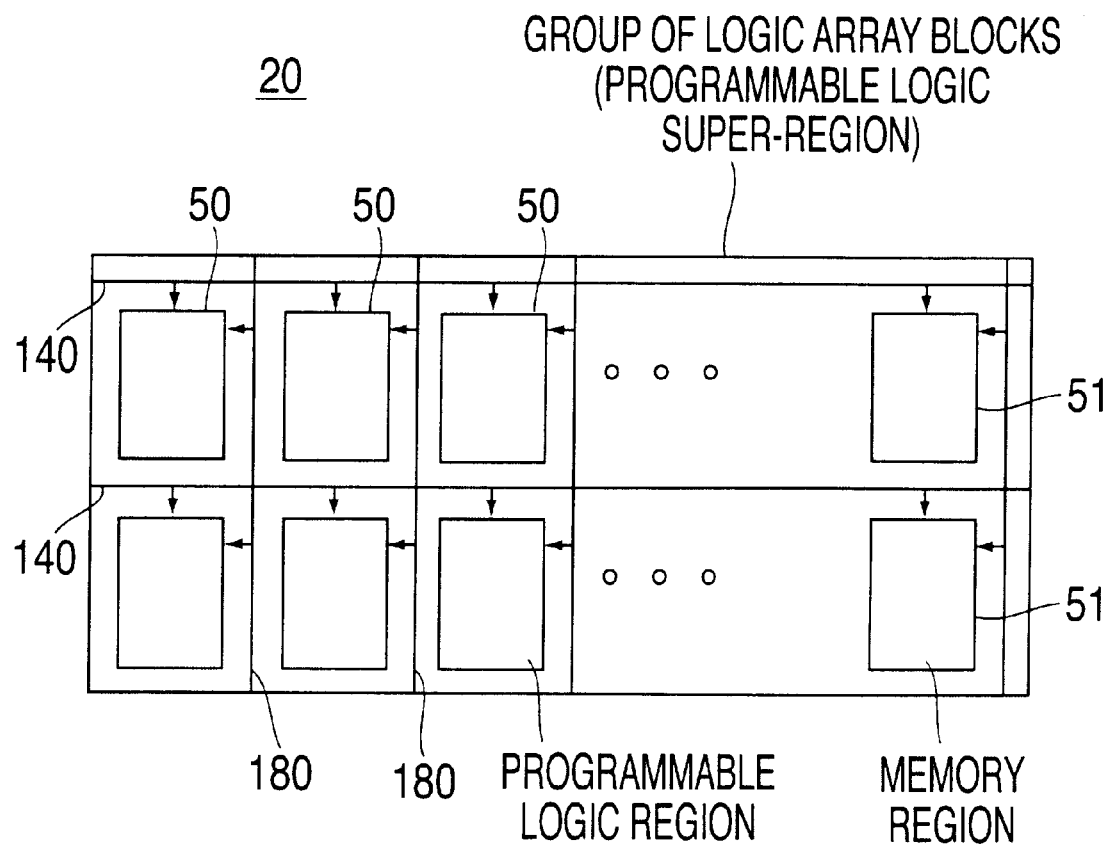
FIG. 2 is a more detailed diagram of a portion of the programmable logic device shown in FIG. 1.

An exemplary embodiment of a representative GOL 20 is shown in more detail in FIG. 2. In the FIG. 2 representation, GOL 20 includes a two dimensional array of rows and columns of programmable logic regions 50. Such programmable logic regions 50 are sometimes called logic array blocks (LABs). Each GOL 20 may include memory regions 51, which may each contain a configurable block of random access memory (RAM) such as static random access memory (SRAM). A typical GOL 20 might include one memory region 51 and a one-by-sixteen array of associated LABs 50 (i.e., 16 LABs 50 in a single row, one LAB 50 in each of 16 columns). Another typical GOL may include two memory regions 51, each associated with its own row of 16 LABs (i.e., two LABs per column).

Figure 3:
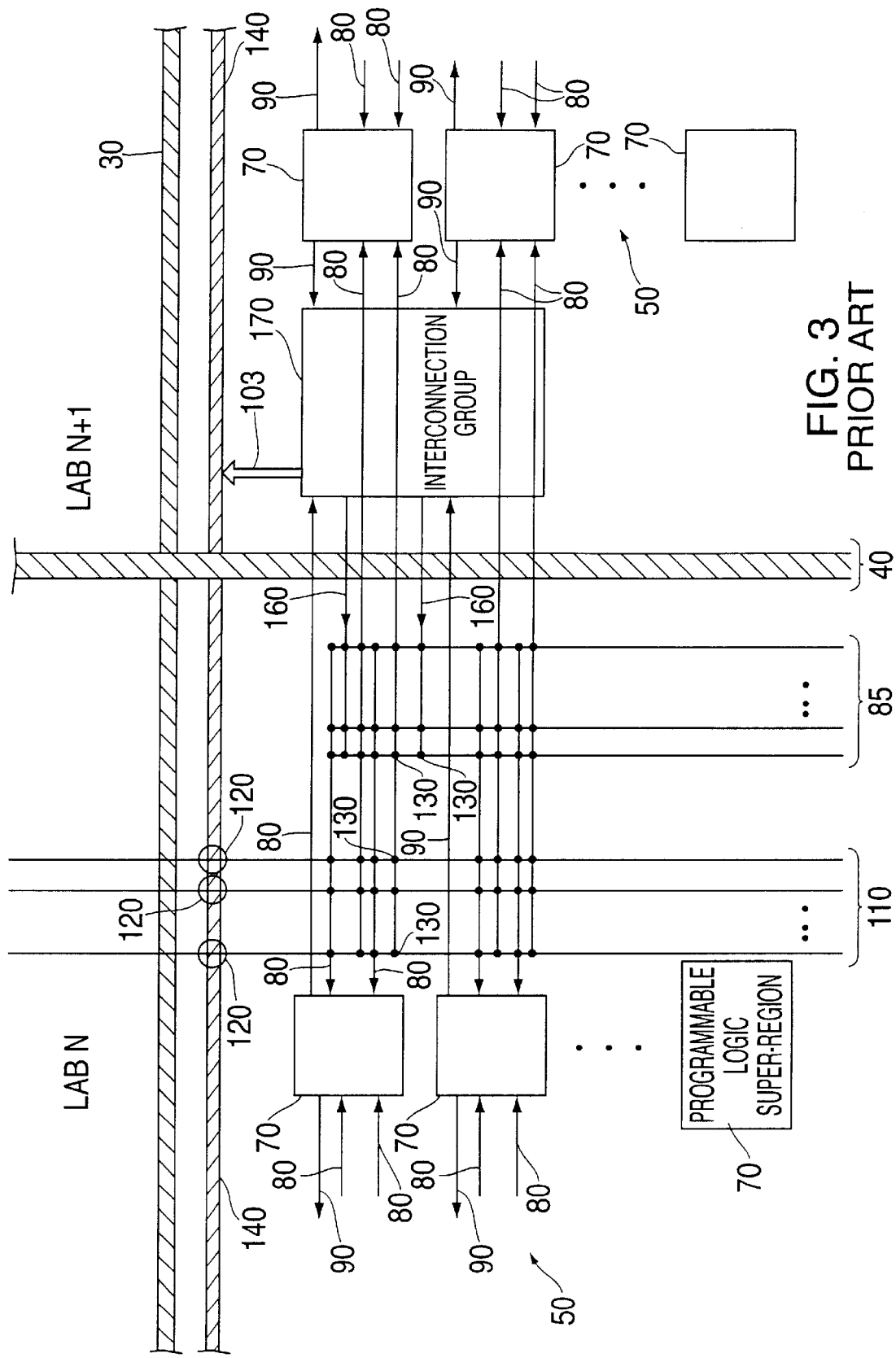
FIG. 3 is an even more detailed diagram of a portion of the programmable logic device shown in FIG. 1.

In FIG. 3, an exemplary embodiment of two representative LABs 50 (N and N+1) is shown within each GOL 20. LABs 50 may be interconnected by inter-region interconnection conductors, such as horizontal inter-region interconnection conductors 140. In the FIG. 3 representation, each LAB 50 includes a plurality of programmable logic subregions 70, which are sometimes called logic elements (LEs). Each logic element 70 is programmable to perform any of a number of logic functions on the logic signals provided at its input conductors 80. For example, each logic element 70 may include a programmable four-input look-up table for producing a look-up table output which is any logical combination of four inputs applied to the logic element by input conductors 80. The output conductors 90 of logic elements 70 are connected to interconnection groups such as interconnection group 170, which selectively route logic element output signals on conductors 90 to vertical inter-super-region interconnection conductors 40, horizontal inter-super-region interconnection conductors 30, horizontal inter-region interconnection conductors 140 (via conductors 103) or local conductors 85 (via conductors 160). Interconnection groups 170 may contain programmable logic connectors ("PLCs") for programmably connecting inputs to the group to outputs of the group. Interconnection group PLCs may be organized in the form of switching circuits such as multiplexers or demultiplexers. Each logic element output signal on a conductor 90 may be fed back within a LAB 50 so that it may be used as an input to any of the logic elements 70 in that region.

Each LAB 50 may include a plurality of LAB-feeding (i.e., region-feeding) conductors 110 for selectively bringing signals from horizontal inter-region conductors 140 into the LAB. PLCs 120 programmably connect horizontal inter-region conductors 140 to LAB-feeding conductors 110 for this purpose. PLCs 120, which may be organized as multiplexers, may be only partially populated with possible connections (i.e., each of LAB-feeding conductors 110 may be programmably connectable to only a subset of horizontal inter-region conductors 140). However, the population densities and distributions of these connections are preferably such that signals traveling on each conductor 140 have several possible paths into a given LAB 50 via conductors 110.

PLCs 130 allow the signals on LAB-feeding conductors 110 and local conductors 85 to be selectively applied to logic element inputs 80. PLCs 130 are configured to act as multiplexers. Logic element input conductors 80 may be configured to allow signals traveling on each region-feeding conductor 110 and each local conductor 85 to be routed to adjacent LABs 50. As shown in FIG. 3, this creates an interleaved input conductor arrangement in which input conductors 80 alternately connect to either a LAB to the left of the local conductors 85 or a LAB to the right of local conductors 85. For example, if one input conductor 80 is connected to LAB N, the next input conductor 80 may be connected to LAB N+1, and the following input conductor 80 may be connected to LAB N, etc.).

The logic circuitry of the LAB 50 shown in FIG. 3 may be generally like the corresponding portion of the LAB structure shown in Cliff et al. U.S. Pat. No. 5,689,195 (see, e.g., FIG. 3 of that patent). Additional features such as those shown in the '195 patent may be included in the LABs 50 if desired. Additional conductors for so-called fast lines and/or clock signal lines, carry and/or cascade interconnections between logic elements 70, lines for register control signals derived from local conductors 85 and/or region feeding conductors 110 may be provided. If desired, the logic elements 70 in LABs 50 can be constructed using product term logic. The LAB arrangement shown in FIG. 3 is illustrative only. Any suitable type of logic array block circuit arrangement may be used if desired.

Figure 4:
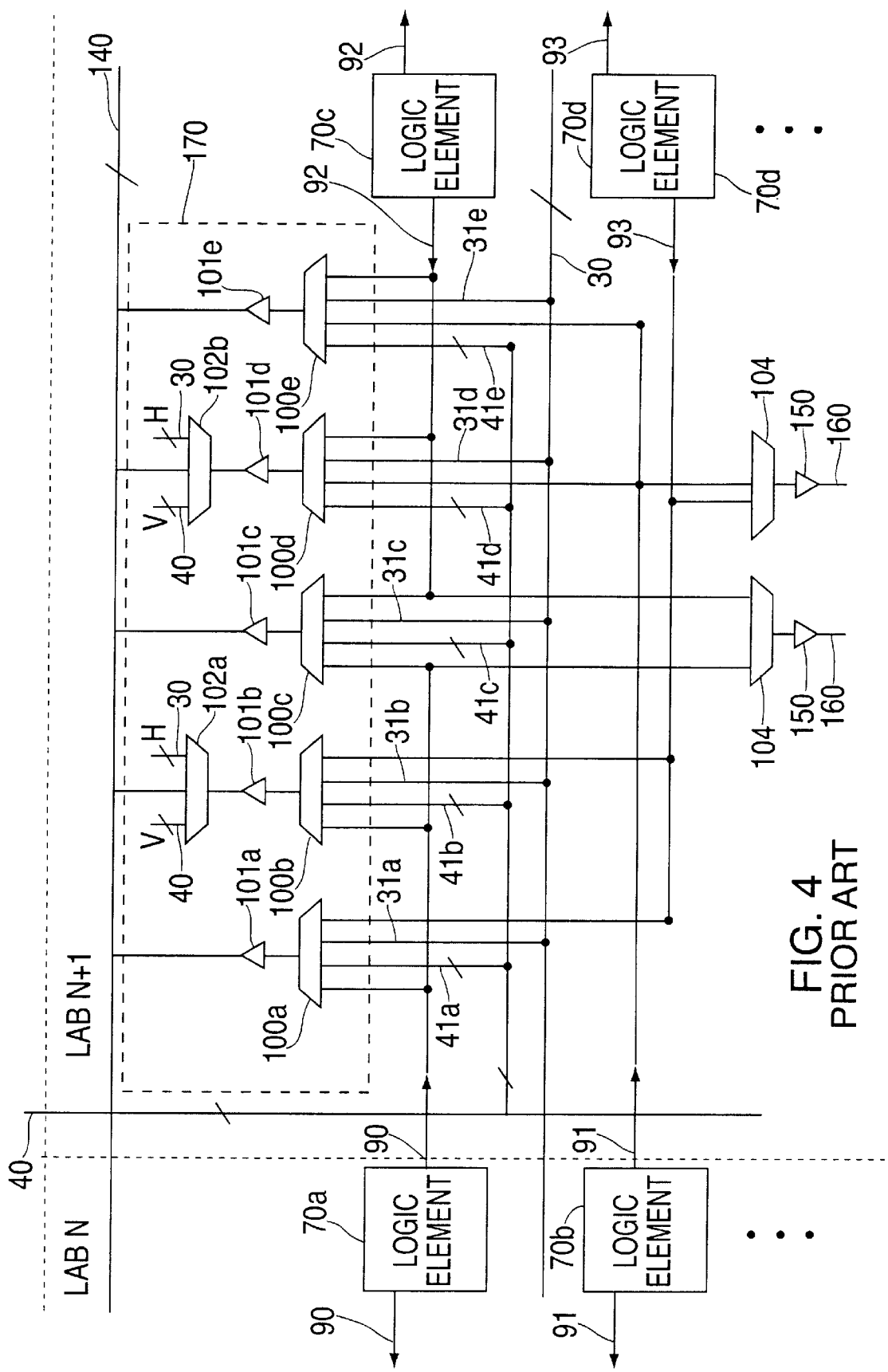
FIG. 4 is a diagram of an illustrative interconnection group in accordance with the present invention.

A portion of an illustrative GOL 20 and the interconnections associated with that GOL 20 are shown in FIG. 4. In addition, illustrative interconnection and driver circuitry that is used by GOL 20 is shown. In particular, FIG. 4 shows an illustrative driver arrangement for interconnecting GOL 20 with the horizontal inter-super-region interconnection conductors 30, vertical inter-super-region interconnection conductors 40, and global horizontal inter-region interconnection conductors 140 that are associated with that GOL 20. Horizontal inter-super-region interconnection conductors 30 (hereinafter "H conductors") and vertical inter-super-region interconnection conductors 40 (hereinafter "V conductors") span the entire length of PLD 10 and provide interconnection among the various GOLs 20 within the PLD 10 (see FIG. 1). Communication between GOLs 20 in the horizontal direction is accomplished by using H conductors 30, whereas communication between GOLs in the vertical direction is accomplished using V conductors 40. If desired, H conductors 30 and V conductors 40 may include fractional-length interconnection conductors (e.g. half-length interconnection conductors, quarter-length interconnection conductors, one-eight-length interconnection conductors, etc.). Such fractional-length interconnection conductors may be selectively interconnected to produce either longer fractional-length conductors or full-length interconnection conductors if desired.

Each set of global horizontal inter-region conductors 140 (hereinafter "GH conductors") spans the entire length of a GOL 20 and provides interconnection among the various LABs 50 and memory regions 51 within that GOL. If desired, GH conductors 140 may include fractional-length interconnection conductors (e.g. half-length, quarter-length, one-eight-length, etc.). Such fractional-length interconnection conductors may be selectively interconnected to produce either longer fractional-length conductors or full-length interconnection conductors if desired. Communication between the LABs 50 and memory regions 51 in a GOL 20 containing a single row of LABs 50 may be accomplished using GH conductors 140. Communications between LABs in a GOL 20 containing more than one row of LABs 50 may be accomplished using comparable global vertical inter-region interconnection conductors 180 (or "GV conductors" not shown).

FIG. 4 also shows how multiplexing and driver circuitry may be used to convey output signals from logic elements 70 to local branch conductors 160. Multiplexers 104 may receive output signals on conductors 91–94 from logic elements 70a–70d and may selectively direct those signals to local branch conductors 160 (preferably via buffers 150). Local branch conductors 160 may be programmably connected (by PLCs such as PLCs 130 of FIG. 3) to LAB-feeding conductors 110 and local conductors 85 (FIG. 3) to provide interconnection pathways among the various logic elements 70 within adjacent LABs 50. (Local drivers 150 and other driver circuitry for LAB 50 of FIG. 3 are not shown in FIG. 3 to avoid over-complicating the drawings.)

Logic designs implemented on PLD 10 typically require signals from the logic elements 70 or memory regions 51 to be routed to other LABs 50 or memory region 51 in the same row. Such signals must generally also be routed to other GOLs 20 within the PLD 10. Several types of interconnection paths may be used to support inter-LAB and inter-GOL communications. For example, communications between the LABs 50 within a GOL 20 may require signals from the logic elements 70 of a LAB 50 and the memory region 51 in the same row as that LAB 50 to be applied to GH conductors 140. Communications between LABs 50 in different GOLs 20 may require the interconnection of multiple conductor types such as V to H, H to V, V to GH, and H to GH.

The driver arrangement shown in FIG. 4 allows signals to be selectively routed among multiple conductor types. Each LAB 50 has a set of associated V conductors 40, H conductors 30, and GH conductors 140. Signals from logic elements 70 are applied to multiple V, H, and GH conductors 40, 30, and 140 along with signals from other V and H conductors 40 and 30 in order to provide each signal with a number of possible paths to each conductor type. This is accomplished by a set of programmable multiplexers 100 (based on PLCs) and demultiplexers 102 (also based on PLCs) which route selected inputs to their outputs. For example, signals from logic elements 70a–d, H conductors 30, and V conductors 40 are applied to certain inputs of multiplexers 100a–e. Multiplexers 100 programmably select from among these input signals and allow the selected signals to pass as outputs to the appropriate conductors, preferably using driver buffers such as GH drivers 101a, 101c and 101e or V/H drivers 101b and 101d. In this way, signals from H and V conductors 30 and 40 and outputs from various logic elements 70 can share direct access to both inter-region interconnection conductors (GH conductors 140), and inter-GOL interconnection conductors (V conductors 40 and H conductors 30) without having to pass through intermediate conductors. Memory regions 51 (FIG. 2) in the same row as a given set of logic elements 70 can be interconnected with a comparable driver arrangement.

One benefit of the interconnection scheme of FIG. 4 is that signals on one type of conductor can readily "turn" to another type of conductor to reach a desired destination. For example, if it is desired to route a signal from a LAB 50 in one GOL 20 to another LAB 50 in a GOL 20 diagonally across PLD 10, the signal may be conveyed horizontally on an H conductor 30, then make an H to V turn and be conveyed on a V conductor 40 until it arrives at the desired GOL 20. The signal could then make an H to GH turn and be conveyed on a GH conductor 140 until it arrives at the desired LAB 50.

Signals traveling on H conductors 30 can be turned to travel along V conductors 40, GH conductors 140, or other H conductors 30. Horizontal branch conductors 31a–31e are provided to allow certain H conductors 30 to be connected to the inputs of programmable multiplexers 100. A signal from an H conductor 30 can be turned to a V conductor 40 by programming a multiplexer such as multiplexer 100d to apply the input signal received from horizontal branch conductor 31d to V/H driver 101d. Programmable demultiplexer 102b receives the output signal from V/H driver 101d and routes it to a selected V conductor 40. Demultiplexer 102b may also be programmed to apply the selected signal to another H conductor 30. A signal from an H conductor 30 can be turned onto a GH conductor 140 by programming a multiplexer such as multiplexer 100c to apply the input signal received from horizontal branch conductor 31c to GH driver 101c. This allows signals from the inter-GOL H conductors 30 to be selectively brought into a GOL 20.

Connections between H conductors 30 and the multiplexers 100 associated with a row of LABs 50 are generally equally distributed among the interconnection groups 170 associated with that row by horizontal branch conductors 31. Each horizontal branch conductor 31 in a given row of LABs 50 is preferably connected to a different one of the H conductors 30 associated with that row of LABS. For example, a row of LABs 50 may include 16 LABs and a memory region 51, each of which may be associated with at least one interconnection group 170 that has five multiplexers 100 (for a total of 80 multiplexers 100 associated with that row). A set of 80 H conductors 30 may be associated with the row, each H conductor 30 being connected to a different multiplexer 100 by a horizontal branch conductor 31. Horizontal branch conductors 31 may be arranged in this way to avoid competition between the H conductors 30 associated with a given row of LABs for the same drivers.

In certain GOL arrangements, however, the number of available multiplexers 100 in a given row of LABs 50 may exceed the number of H conductors 30 associated with that row of LABs. For example, each LAB 50 may include five interconnection groups 170, each of which may have multiple multiplexers 100. LABs of this type may be arranged in a row so that there are that five rows of interconnection groups 170 within a row of LABs 50.

Figure 5:
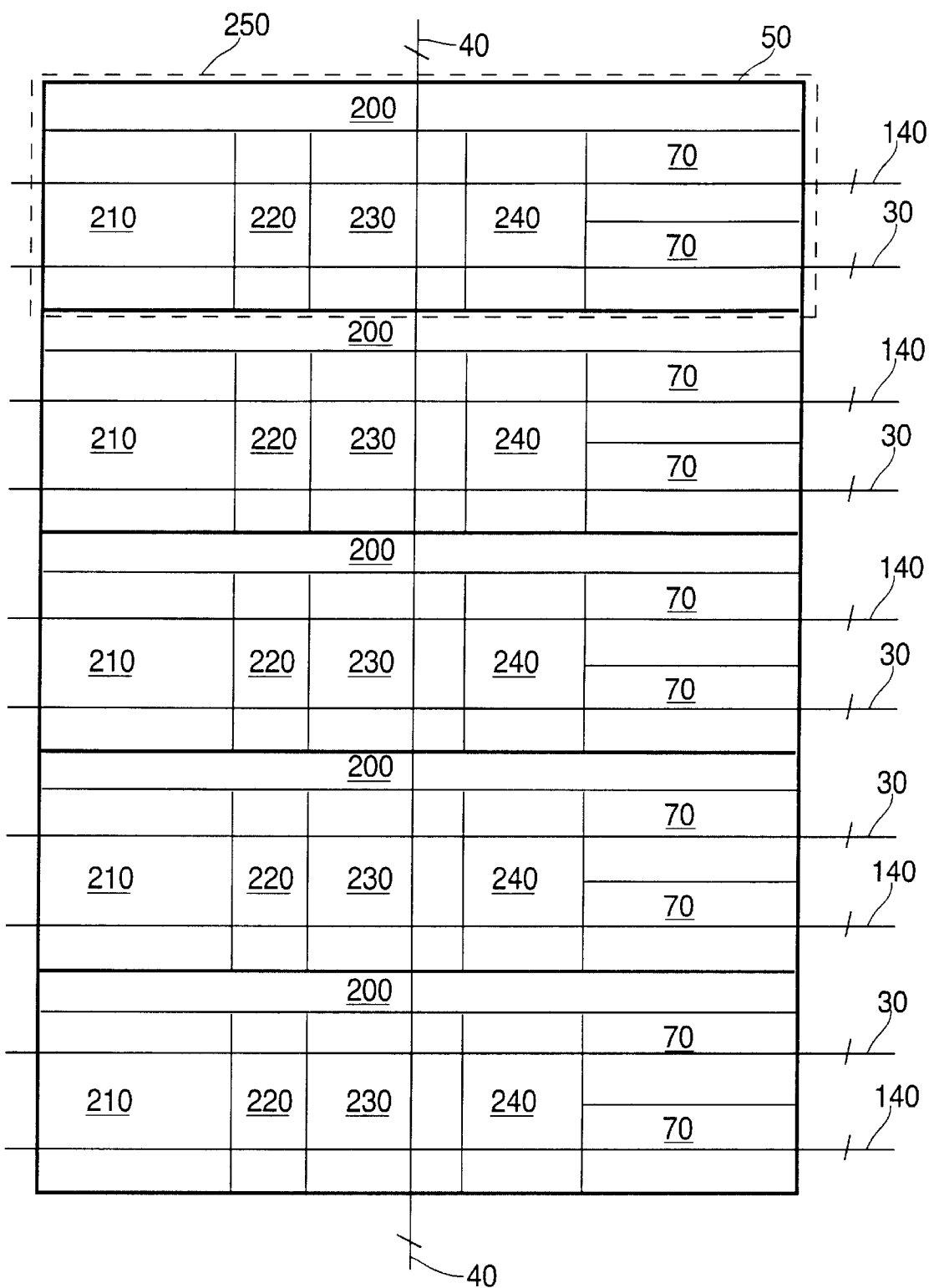
FIG. 5 is a block diagram of how the interconnection resources of FIGS. 3 and 4 may be physically disposed on the programmable logic device of FIG. 1.

As described above, a set of multiple H conductors 30 may be associated with a given row of LABs. This set of multiple H conductors 30 may be divided into subsets so that each of the subsets may be associated with a different one of the multiple rows of interconnection groups 170. This is illustrated in FIG. 5. In one suitable GOL arrangement, a set of 100 H conductors 30 associated with a row of LABs may be divided into five subsets of 20 conductors each. A given row of LABs may contain 16 LABs 50 and a memory region 51. Each one of the five subsets of H conductors 30 may be associated with a different one of the five rows of interconnection groups 170 so that a total of 80 multiplexers 100 may be associated with that row of interconnection groups. In this case, each H conductor 30 may be connected to multiple different multiplexers 100 in its row of interconnection groups. For example, each H conductor 30 may be connected to four different multiplexers 100, each multiplexer preferably being in a different interconnection group 170. This arrangement distributes H conductors 30 evenly among interconnection groups 170 and improves routing flexibility within a given GOL 20 by providing signals traveling on each H conductor 30 with pathways to multiple multiplexers 100.

As shown in FIG. 4, each interconnection group 170 may include three multiplexers 100 (GH multiplexers) for selectively connecting signals to GH conductors 140 and two multiplexers 100 (V/H multiplexers) for selectively connecting signals to V conductors 40 or H conductors 30. In GOL arrangements wherein each H conductor 30 is connected to only two multiplexers 100 within a given row of LABs, each H conductor 30 may be connected to at least one of each multiplexer type within that GOL (i.e., one GH multiplexer and one V/H multiplexer). However, in GOL arrangements wherein each H conductor 30 is connected to more than two (e.g., four), multiplexers 100 the number of connections to each multiplexer type may be varied to suit particular needs. For example, each H conductor 30 may be connected to one V/H multiplexers and three GH multiplexers per GOL.

H conductors 30 need not always be connected to multiplexers 100 in whole number ratios. For example, H conductors 30 may be connected on average to 1.6 V/H multiplexers in a given row of interconnection groups. This type of fractional interconnecting may be implemented by overlapping at least some of the connections between horizontal branch conductors 31 and H conductors 30. For example, each H conductor 30 may be connected to either one or two V/H multiplexers 100 in a row of interconnection groups (i.e., by connecting each H conductor 30 to either one or two horizontal branch conductors 31 associated with that row). Similarly, each H conductor 30 may connect to either two or three GH multiplexers 100 in a row of interconnection groups (i.e., by connecting each H conductor 30 to either two or three horizontal branch conductors 31 associated with that row). This interconnection scheme may be employed in GOL arrangements where the number of H conductors 30 associated with a row of interconnection groups is not a perfect multiple of the number of horizontal branch conductors 31 in that row.

This fractional overlapping interconnection scheme between the sets of horizontal branch conductors 31 and H conductors 30 is preferably implemented in a random fashion. This may be done to make the routing capability of each LAB 50 similar so that one LAB 50 is not greatly preferred over another when forming a particular pattern of interconnections. Distributing interconnections in this way reduces the number of special interconnection cases, thus making routing problems easier to solve.

Signals traveling on V conductors 40 can be turned to travel along H conductors 30, GH conductors 140, or other V conductors 40. Vertical branch-feeding conductors 42 are used to connect V conductors 40 to vertical branch conductors 41a–e, which in turn are connected to certain inputs of programmable multiplexers 100. A signal from a V conductor 40 can be turned onto an H conductor 30 by programming a multiplexer such as multiplexer 100b to apply the input signal received from one of vertical branch conductors 41b to V/H driver 10b. Programmable demultiplexer 102a receives the output signal from 101b and routes it to a selected H conductor 30. Demultiplexer 102a may also be programmed to route the selected signal to another V conductor 40. A signal from a V conductor 40 can be applied to a GH conductor 140 by programming a multiplexer such as multiplexer 100a to apply the input signal received from one of vertical branch conductors 41a to GH driver 101a. This allows signals from the inter-GOL V conductors 40 to be selectively brought into a GOL 20.

Connections between V conductors 40 and multiplexers 100 associated with a column of LABs 50 are generally equally distributed among the interconnection groups 170 associated with that column of LABs 50 by vertical branch-feeding conductors 42 and vertical branch conductors 41. Each set of vertical branch-feeding conductors 42 in a given LAB 50 may be connected to only a portion of the total number of V conductors 40 associated with that LAB 50 such that each V conductor 40 has access to at least two different sets of vertical branch-feeding conductors 42 within that LAB 50.

Output signals from GH drivers such as drivers 100a, 100c, and 100e of FIG. 4 are applied directly to GH conductors 140, whereas output signals from V/H drivers such as drivers 101b and 101d are further applied to routing demultiplexers 102a and 102b to allow selective routing to one or more of several V conductors 40 and H conductors 30. The direct-drive capability of the GH drivers affords-the GH conductors 140 a speed benefit, allowing communications between the LABs 50 and memory regions 51 in a given GOL 20 to be accomplished using GH conductors 140 without a significant time penalty. On the other hand, the V and H conductors 40 and 30 are long compared to the GH conductors 140 causing them to have a somewhat higher resistance and capacitance. As a result, there is less benefit in driving V and H conductors 40 and 30 directly. Driving V conductors 40 and H conductors 30 through a demultiplexer therefore provides a way to increase logic density without incurring significant incremental speed penalties. If desired, drivers 101a–101e may be programmably-controlled tri-state drivers, so that more than one such driver can be connected to a given one of conductors 30, 40, or 140.

As shown in FIG. 4, signals from V and H conductors 40 and 30 and adjacent LABs N and N+1 are routed to GH, V, and H conductors 140, 40, and 30 through interconnection group 170 (i.e. drivers 101, multiplexers 100, and demultiplexers 102). In the arrangement of FIG. 4, each logic element 70 has an associated interconnection group 170. The interconnection group 170 handles signals for the LAB 50 with which it is associated and handles signals for an adjacent LAB 50. For example, interconnection group 170 in FIG. 4 handles signals for LAB N+1 and adjacent LAB N. This arrangement allows logic elements 70 from two adjacent LABs 50 to have access to the same interconnection group 170. For example, each interconnection group 170 can be driven by four logic elements 70, two of which are from LAB N (70a and 70b) and two of which are from LAB N+1 (70c and 70d). The connections made by interconnection group 170 are arranged to avoid competition between the logic elements 70 in a LAB 50 for the same drivers. For example, a logic element 70 from LAB N can share GH and/or V/H drivers with logic elements 70 from LAB N+1, but not with another logic element 70 from LAB N. Logic elements 70 within a LAB 50 may share the resources of same interconnection group 170, but are preferably connected to different drivers within that group.

This arrangement is illustrated in FIG. 4, where logic element 70a of LAB N and logic element 70d of LAB N+1 share GH and V/H drivers 101a and 101b, whereas logic element 70b of LAB N shares drivers 101d and 101e with logic element 70c of LAB N+1. The middle GH driver 101c is shared between logic element 70a of LAB N and logic element 70c of LAB N+1. The driver routing arrangement of FIG. 4a provides routing flexibility on PLD 10 while eliminating driver contention among the logic elements 70 in a LAB 50 by ensuring that the multiplexers 100 in a given interconnection group 170 do not receive output signals exclusively from any one LAB.

Interconnection groups 170 can be arranged in a variety of ways to allow signals access to different conductors types. In the FIG. 4 arrangement, multiplexers 100 allow signals from each interconnection group 170 to be connected to two V/H drivers 101b and 101d and three GH drivers 101a, 101c, and 101e. This arrangement is illustrative only and other such suitable arrangements may be used if desired. For example, interconnection groups 170 can be configured to include other even or odd combinations of GH and V/H drivers. Additional multiplexers and demultiplexers may be added to the interconnection group 170 in order to provide enhanced routing flexibility. Multiplexers 100 having a different number of inputs may be used to accommodate signals from a different number of conductors. Demultiplexers 102 having a different number of outputs may be used to direct signals to a different number of conductors. Other examples of suitable interconnection groups 170 may be found in U.S. Patent application Ser. No. 09/260,990, which is hereby incorporated by reference in its entirety.

FIG. 5 is a block diagram of how the interconnection resources of FIGS. 3 and 4 may be physically disposed on a given LAB 50 in PLD 10. Portions of the interconnection resources of LAB 50 have been grouped togther into "blocks" in order to facilitate interconnectivity, optimize use of the metallization resources, and increase the logic density of PLD 10. Generally speaking, semiconductor circuit elements such as multiplexers 100 and line drivers 101 are disposed on the diffusion layer of PLD 10 while interconnection conductors such as GH and H conductors 140 and 30 are on metallization layer(s) located above the diffusion layer. Specific representations of the circuitry and interconnections within each block have been omitted to avoid over-complicating the drawing.

As shown in FIG. 5, LAB 50 generally includes adjacent interconnection blocks 200, 210, 220, 230, and 240. Interconnection blocks 210, 220, and 230 include some of the interconnection resources depicted in FIG. 3, and blocks 200 and 240 contain some of the interconnection resources shown in FIG. 4. Each set of interconnection blocks (i.e., blocks 200, 210, 220, 230, and 240) may be associated with a number of logic elements 70 within each LAB 50. For example, in FIG. 5, each set of interconnection blocks is associated with a pair of logic elements 70 in one LAB and two logic elements in an adjacent LAB (not shown). This is sometimes called a unified logic element pair (ULP) 250.

Beginning with the left-hand side of FIG. 5, local interconnection block 210 may include LAB-feeding conductors 110, local conductors 85, PLCs 130, and input conductors 80. LAB-feeding conductors 110 preferably traverse the length of LAB 50 and are used to selectively bring signals from GH conductors 140 into the LAB (via PLCs 120). Local conductors 85 also preferably traverse the length of LAB 50 and are used to recirculate signals within a given LAB 50 and to connect to other logic elements 70 in adjacent LABs. PLCs 130 within region 210 allow the signals on LABL-feeding conductors 110 and local conductors 85 to be selectively applied to logic element inputs 80.

Interconnection block 230 includes PLCs 120 for bringing signals from GH conductors 140 into the LAB. If desired, line drivers for LAB-feeding conductors 110 may be disposed within interconnection block 220. Signals which enter a given LAB from a GH conductor 140 may first pass through a PLC 120 in block 230, then optionally through a line driver in block 220, and enter a particular LAB 50 via conductors 110.

Although each group of H conductors 30 and GH conductors 140 associated with a ULP 250 are shown concentrated in one area in FIG. 5, they are preferably spread out across the ULP so that they span the full vertical length of block 230 (i.e., the distance from top to bottom). This allows H conductors 30 and GH conductors 140 to connect to block 230 (and/or blocks 210 and 240) at selected points across its entire area, which promotes uniform logic distribution throughout PLD 10 and reduces cross talk within the device (discussed in more detail below).

Vertical interconnection block 200 may include vertical branch conductors 41, vertical branch-feeding conductors 42, a portion of multiplexers 100, and a portion of demultiplexers 102. This block contains circuitry which can be used to connect signals from V conductors 40 to GH conductors 140, H conductors 30, and other V conductors 40. For example, block 200 may include the portion of V/H multiplexers 100b and 100d responsible for routing signals traveling on vertical branch-feeding conductors 41b and 41d to demultiplexers 102a and 102b. It may also contain the portion of GH multiplexers 100a, 100c, and 100e responsible for routing signals traveling on vertical branch-feeding conductors 41a, 41c, and 41e to GH conductors 140. The portion of demultiplexers 102a and 102b that connect signals to V conductors 40 may also be included.

Although V conductors 40 are shown concentrated in one area in FIG. 5, they are preferably spread out across LAB 50 so that they span the full horizontal length of block 200 (i.e., the distance from left to right). This allows V conductors 40 to connect to block 200 at selected points across its entire area, which promotes uniform logic distribution throughout PLD 10 and reduces cross talk within the device.

Horizontal interconnection block 240 may include horizontal branch conductors 31, GH and V/H line drivers 101, local line multiplexers 104 and local line buffers 150, conductors 90–93, the remaining portion of multiplexers 100, and the remaining portion of demultiplexers 102. This block preferably contains circuitry which can be used to connect signals from H conductors 30 and logic elements 70 to GH conductors 140. It may also contain circuitry for connecting logic elements 70 to local lines 85. For example, block 240 may include the portion of multiplexers 100a, 100c, and 100e needed for routing signals to GH conductors 140 from horizontal branch conductors 31 and conductors 90–93. It may also contain and the portion of V/H multiplexers 100b and 100d responsible for routing these signals to demultiplexers 102a and 102b. The portion of demultiplexers 102a and 102b that connect signals to H conductors 30 may also be included.

Because V/H line drivers 101 are located in block 240, signals destined for V conductors 40 may be routed from V/H multiplexers 100 within block 200 to V/H line drivers 101 in block 240 and then to the V portions of demultiplexers 102 in block 200. If desired, however, V/H drivers 101 may be placed in block 200 or split among blocks 200 and 240. In this case, some or all of the signals may need to be sent out of their respective interconnection blocks to connect to line drivers 101 and then returned for demultiplexing.

The arrangement of FIG. 5 allows a more efficient use of the metallization resources of a PLD by distributing interconnection conductors throughout the device. Prior art PLDs tend to concentrate interconnection conductors (like H conductors 30 and GH conductors 140) into a specific region of the device, which consumes a large amount of metallization in one particular area. This causes the corresponding portion of the diffusion layer to be essentially unused while other metallization resources elsewhere in the device, and particularly elsewhere in the LAB, are also unused. For example, in FIG. 5, if all GH conductors 140 associated with LAB 50 were grouped together in one region rather than distributed, the area associated with GH conductors 140 would be metal-limited. That is, the circuitry on the corresponding diffusion layer (e.g., PLCs 120) would take up much less space than the GH conductors 140 they connect to. As a result, the logic density of the associated diffusion layer is undesirably low. Additionally, in portions of the diffusion layer where logic density is high, and the number of connections to interconnection conductors is relatively small, the metallization resources are under utilized. Devices constructed in this manner either sacrifice logic density for metallization use or vice-versa.

Another problem commonly encountered in grouped-conductor architectures is the noise that occurs on idle conductors from interactions with stray electromagnetic fields that originate from active (pulsed) conductors. This phenomena is referred to cross-talk and is generally attributable to parasitic capacitances between nearby conductors. Groupe-dconductor architectures suffer from cross-talk because of the relatively large number of active and idle conductors in close proximity with one another. This prevents such architectures from being easily scalable to smaller integrated circuit technologies.

The arrangement of FIG. 5, however, solves these problems by distributing interconnection conductors throughout the device. For example, by distributing H conductors 30 and GH conductors 140 throughout LAB 50, the number of conductors within close proximity of one another is reduced, which decreases the effects of cross-talk on the device and therefore allows LAB 50 to be easily scaled to smaller integrated circuit technologies. Furthermore, the distributed-conductor scheme of the present invent-ion significantly reduces the area of low-density logic regions and promotes the uniform use of interconnection conductors (i.e., metallization resources) throughout the device.

The interconnection block arrangement shown in FIG. 5 has been found to minimize the number of metallization tracks required for the interconnection conductors, optimizing the "conductor density" within PLD 10. Nevertheless, it will be understood that numerous other interconnection block arrangements are also possible. For example, the position of interconnection blocks relative to one another could be changed, (e.g., the position of blocks 210 and 240 could be interchanged, etc.) and the interconnection resources within each interconnection block could be modified if desired (e.g., local conductors 85 and drivers 101 could be moved to other blocks, the components of block 220 could be absorbed into block 230, etc.).

Figure 6:
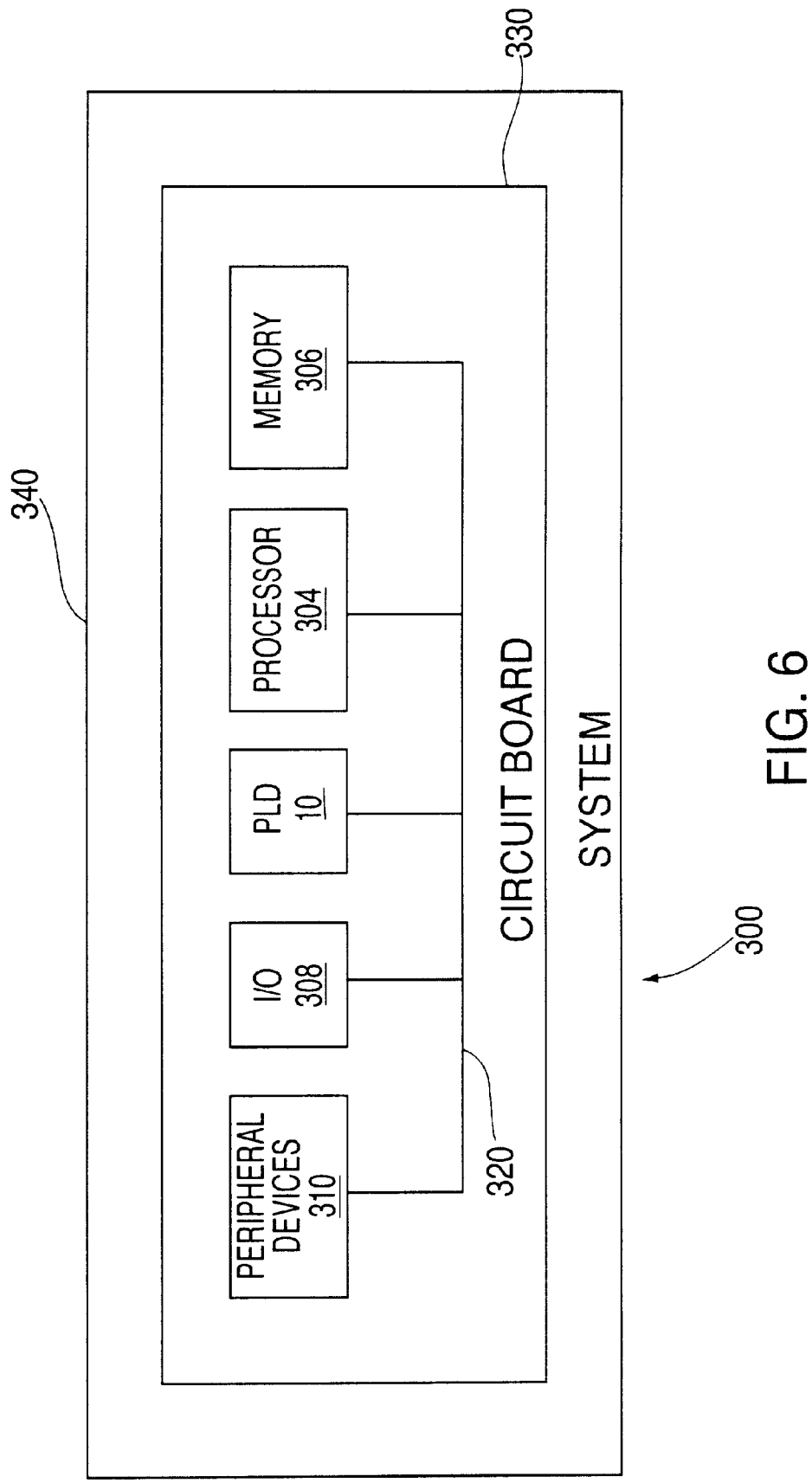
FIG. 6 is a block diagram showing an illustrative use of the programmable logic devices in accordance with the present invention.

FIG. 6 illustrates a programmable logic device 10 (which includes the interconnection circuitry in accordance with this invention) in a data processing system 300. In addition to device 10, data processing system 300 may include one or more of the following components: a processor 304; memory 306; I/O circuitry 308; and peripheral devices 310. These components are coupled together by a system bus 320 and are populated on a printed circuit board 330 which is contained in an end-user system 340.

System 300 can be used in a wide variety of applications, such as computer networking, data networking, instrumentation, video processing, digital signal processing, or any other application where the advantage of using reprogrammable logic is desirable. Programmable logic device 10 can be used to perform a variety of different logic functions. For example, programmable logic device 10 can be configured as a processor or controller that works in cooperation with processor 304. Programmable logic device 10 may also be used as an arbiter for arbitrating access to a shared resource in system 300. In yet another example, programmable logic device 10 can be configured as an interface between processor 304 and one of the other components in system 300. It should be noted that system 300 is only exemplary, and that the true scope and spirit of the invention should be indicated by the following claims.

The PLCs mentioned throughout this specification can be implemented in any of a wide variety of ways. For example, each PLC can be a relatively simple programmable connector such as a switch or a plurality of switches for connecting any one of several inputs to an output (i.e., PLCs may be organized as switching circuits such as multiplexers and demultiplexers). Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. The components of PLCs can be controlled by various, programmable, function control elements ("FCEs"), which are not always shown separately in the accompanying drawings. With certain PLC implementations (e.g., fuses and metal optional links) separate FCE devices are not required, so that in those cases any depiction of FCE devices in the accompanying drawings merely indicates that the PLCs are programmable. Like PLCs, FCEs can be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable both to one-time-only programmable and reprogrammable devices.

One skilled in the art will appreciate that the present invention can be practiced by other than the described embodiments, which are presented for the purposes of illustration and not limitation. The present invention is to be limited only by the claims which follow.

The invention claimed is:

1. An efficient arrangement of a logic device comprising:
   a plurality of logic resources disposed across a substrate of the logic device;
   a plurality of interconnection conductors distributed throughout metallization layers associated with the logic device such that interconnection conductor density is substantially constant over a majority of metallization areas to reduce the area of low density logic regions; and
   wherein at least some of the logic resources are coupled to at least some of the interconnection conductors to interconnect logic resources on the logic device.

2. The logic device of claim 1 wherein the interconnection conductors coupled to the logic resources are disposed substantially above the logic resources.

3. The logic device of claim 1 wherein the logic resources include interconnection blocks and logic elements.

4. The logic device of claim 3 wherein the logic resources are organized into logic array blocks having logic elements arranged in a first direction wherein each logic element has a corresponding pair logic element in an adjacent logic block.

5. The logic device of claim 4, wherein the interconnection blocks associated with a logic array block couple the logic array block through at least some of the interconnection conductors to the logic element pairs in the logic array block and the adjacent logic array block.

6. The logic device of claim 5, wherein the interconnection blocks are located substantially left of the logic elements in the corresponding logic array block and grouped in sections according to a type of interconnection conductor being coupled to the logic resources.

7. The logic device of claim 6, wherein the interconnection blocks coupling the interconnection conductors to inputs of the logic element pairs.are located furthest to the left and the interconnection blocks coupling outputs of the logic element pair are located adjacent to one of the logic element pair.

8. The logic device of claim 1 wherein the logic resources are disposed substantially uniformly across the substrate to enable maximum use of the diffusion for the logic resources.

9. The logic device of claim 1 wherein the interconnection conductors are spaced apart from one another substantially evenly to minimize cross-talk.

10. A method for efficiently using metallization resources on a programmable logic device comprising:
    disposing a plurality of logic resources across a substrate of the programmable logic device;
    distributing a plurality of interconnection conductors throughout metallization layers associated with the programmable logic device to reduce metallization areas having a low interconnection conductor density; and
    coupling at least some of the logic resources to at least some of the interconnection conductors to interconnect logic resources on the programmable logic device.

11. The method of claim 10, further comprising disposing a plurality of interconnection blocks on the substrate of the programmable logic device.

12. The method of claim 11, wherein the logic resources include logic array blocks and groups of logic, array blocks, the method further comprising interconnecting at least some of the logic array blocks via interconnection blocks.

13. The method of claim 11 further comprising interconnecting at least some of the groups of logic array blocks via interconnection blocks.

14. The method of claim 13 wherein the distributing further comprises spacing the interconnection conductors apart from one another substantially evenly to minimize cross-talk.

15. The method of claim 10, wherein the distribution of interconnection conductors also minimizes the substrate area having a low logic density.

16. A logic device having efficient use of diffusion and metal layers, comprising:
    logic resources disposed substantially uniformly across the substrate of the programmable logic device to reduce the substrate area having a low logic resource density;
    interconnection conductors distributed substantially uniformly throughout the metal layers of the logic device to minimize the metal layers having a low interconnection conductor density; and
    coupling at least some of the logic resources to at least some of the interconnection conductors to interconnect logic resources on the programmable logic device.

17. A digital processing system comprising:
    processing circuitry;
    a memory coupled to said processing circuitry; and
    a logic device as defined in claim 1 coupled to the processing circuitry and the memory.

18. A printed circuit board on which is mounted a mask-programmed logic device as defined in claim 1.

19. The printed circuit board defined in claim 18 further comprising memory circuitry mounted on the printed circuit board and coupled to the mask-programmed logic device.

20. The printed circuit board defined in claim 18 further comprising processing circuitry mounted on the printed circuit board and coupled to the memory circuitry.

* * * * *